(12) United States Patent
Hu et al.

(10) Patent No.: US 12,068,214 B2
(45) Date of Patent: Aug. 20, 2024

(54) DISPLAY PANEL WITH GROOVES AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Peng Hu, Hubei (CN); Yanqiang Duan, Hubei (CN); Congcong Jiang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 469 days.

(21) Appl. No.: 17/419,353

(22) PCT Filed: Apr. 26, 2021

(86) PCT No.: PCT/CN2021/089974
§ 371 (c)(1),
(2) Date: Jun. 29, 2021

(87) PCT Pub. No.: WO2022/222164
PCT Pub. Date: Oct. 27, 2022

(65) Prior Publication Data
US 2022/0359330 A1 Nov. 10, 2022

(30) Foreign Application Priority Data
Apr. 19, 2021 (CN) .......................... 202110415845.7

(51) Int. Cl.
*H01L 23/31* (2006.01)
*H01L 27/12* (2006.01)

(52) U.S. Cl.
CPC ...... *H01L 23/3142* (2013.01); *H01L 27/1218* (2013.01); *H01L 27/1262* (2013.01)

(58) Field of Classification Search
CPC ............ H01L 23/3142; H01L 27/1218; H01L 27/1262; H10K 71/00; H10K 71/851;
(Continued)

(56) References Cited

U.S. PATENT DOCUMENTS 8,120,028 B2 * 2/2012 Tung ................. G02F 1/133711
438/30
10,573,704 B2 * 2/2020 Cai ........................ H10K 71/00
(Continued)

FOREIGN PATENT DOCUMENTS

CN 108807480 A 11/2018
CN 110660828 A 1/2020
(Continued)

*Primary Examiner* — Jami Valentine Miller
*Assistant Examiner* — Pratiksha Jayant Lohakare
(74) *Attorney, Agent, or Firm* — Rivka Friedman

(57) ABSTRACT

A display panel and a manufacturing method thereof are provided. In the manufacturing method of the display panel, a corner-cutting area of a to-be-cut display panel is provided with a cutting groove. The cutting groove penetrates a buffer layer and extends into a flexible substrate. Furthermore, the cutting groove is provided with an inorganic encapsulation layer and a sacrificial layer. Therefore, when cutting the to-be-cut display panel along the cutting groove, cracks generated during a process can be reduced, thereby alleviating a problem of micro-cracks affecting a packaging effect of conventional display panels during a secondary cutting process.

20 Claims, 7 Drawing Sheets

(58) Field of Classification Search
CPC ............. H10K 50/844; H10K 59/1201; H10K 77/111; H10K 59/12
USPC .......................................................... 257/73
See application file for complete search history.

(56) References Cited

U.S. PATENT DOCUMENTS

| | | | |
|---|---|---|---|
| 11,079,879 B1* | 8/2021 | Li | ........................ G06F 3/04164 |
| 2015/0102291 A1* | 4/2015 | Park | ..................... H10K 59/352 |
| | | | 257/40 |
| 2016/0181331 A1* | 6/2016 | Li | ........................... H10K 71/00 |
| | | | 438/34 |
| 2016/0307929 A1* | 10/2016 | Zhang | ................. H01L 27/1237 |
| 2017/0069701 A1* | 3/2017 | Cai | ........................ H10K 71/00 |
| 2017/0155082 A1* | 6/2017 | Mu | ..................... H10K 50/8428 |
| 2018/0159075 A1* | 6/2018 | Kim | ..................... H01L 27/1225 |
| 2018/0190631 A1* | 7/2018 | Kim | ....................... G06F 3/1446 |
| 2018/0212179 A1* | 7/2018 | Yu | ........................ H10K 50/171 |
| 2018/0366672 A1* | 12/2018 | Wang | ....................... C09K 11/08 |
| 2019/0341565 A1* | 11/2019 | Li | ......................... H10K 50/844 |
| 2020/0006700 A1* | 1/2020 | Kim | ....................... H10K 59/60 |
| 2020/0203455 A1* | 6/2020 | Xie | ...................... H10K 59/124 |
| 2021/0083232 A1* | 3/2021 | Ma | ...................... H10K 59/124 |
| 2021/0343986 A1* | 11/2021 | Zheng | ................... H10K 59/12 |

FOREIGN PATENT DOCUMENTS

| | | |
|---|---|---|
| CN | 111416063 A | 7/2020 |
| CN | 111430566 A | 7/2020 |

\* cited by examiner

DISPLAY PANEL WITH GROOVES AND MANUFACTURING METHOD THEREOF

FIELD

The present disclosure relates to the field of display technologies, and more particularly, to a display panel and a manufacturing method thereof.

BACKGROUND

With technological development of smart terminal devices and wearable devices in recent years, demands for flat panel displays have become more and more diversified. Organic light-emitting diode (OLED) displays, which have self-luminous characteristics, are more energy-efficient than liquid crystal displays (LCDs) without a backlight module.

Nowadays, when manufacturing display panels, entire processes are performed on a motherboard. Then, the motherboard is cut and separated to complete subsequent module processes. Taking flexible display panels as an example, multiple flexible display panels are formed on a motherboard. Then, the motherboard is cut to form a plurality of individual flexible display panels which are to be cut a second time with a laser according to appearance requirements of actual products. However, conventional laser cutting processes usually result in micro-cracks formed in a cutting area. The micro-cracks extend along an inorganic layer in the cutting area to the inorganic layer in a packaging structure, which finally affects a packaging quality of the flexible display panel and leads to a failure of products due to black spots. With diversification of market demand, appearances of actual products have become more and more diverse. Therefore, some special cutting shapes have emerged. For example, a chamfering position of a multi-curved screen is cut. Due to characteristics of multi-curved screens, a large-rounded-angle design must be applied to the multi-curved screens to ensure that a long edge will not overlap with a short edge. Consequently, a cutting path in a rounded area during a laser cutting process is significantly increased, increasing risks of cracks generated due to a cutting process.

Therefore, a problem of micro-cracks affecting a packaging effect of conventional display panels during a secondary cutting process needs to be solved.

SUMMARY

The present disclosure provides a display panel and a manufacturing process thereof to alleviate a following technical issue: micro cracks are generated during a secondary cutting process and affects an encapsulation effect.

To solve the above issue, technical solutions provided by the present disclosure are as follows.

An embodiment of the present disclosure provides a display panel, comprising a display area and a frame area surrounding the display area, wherein the frame area is provided with a corner-cutting area, and the display panel in the corner-cutting area comprises a flexible substrate, a buffer layer, an encapsulation layer, and a sacrificial layer. The buffer layer is disposed on the flexible substrate, a first groove is formed on an end of the flexible substrate near a side of the buffer layer, and a bottom of the first groove extends toward the display area. The inorganic encapsulation layer is disposed on an upper surface and a lateral surface of the buffer layer and disposed in the first groove. The sacrificial layer is disposed on the inorganic encapsulation layer in the first groove and fills the first groove. Wherein, in the corner-cutting area, a length of the buffer layer is less than a length of the flexible substrate.

In the display panel provided by an embodiment of the present disclosure, a sacrificial layer is further disposed on the inorganic encapsulation layer on a side of the buffer layer.

In the display panel provided by an embodiment of the present disclosure, an angle between a lateral surface of the flexible substrate and a lower surface of the flexible substrate is less than 90 degrees.

In the display panel provided by an embodiment of the present disclosure, an angle between a lateral surface of the flexible substrate and a lower surface of the flexible substrate is greater than 80 degrees.

In the display panel provided by an embodiment of the present disclosure, a cross-sectional shape of the first groove comprises an arc.

In the display panel provided by an embodiment of the present disclosure, the buffer layer is further provided with at least one second groove, the second groove penetrates the buffer layer and extends to the flexible substrate, and the inorganic encapsulation layer is further disposed in the second groove.

In the display panel provided by an embodiment of the present disclosure, the second groove comprises a first opening and a second opening penetrating each other, the first opening is defined in the buffer layer, the second opening is defined in the flexible substrate, and a width of the first opening is less than a width of the second opening.

In the display panel provided by an embodiment of the present disclosure, a depth of the second opening is less than a thickness of the flexible substrate.

In the display panel provided by an embodiment of the present disclosure, a cross-sectional shape of the second opening comprises rectangular and arc.

In the display panel provided by an embodiment of the present disclosure, an extending end of the first groove and an extending end of the second opening are on a same horizontal plane.

In the display panel provided by an embodiment of the present disclosure, an interval is defined between the first groove and the second groove.

In the display panel provided by an embodiment of the present disclosure, the frame area is further provided with a plurality of edge-cutting areas, and the corner-cutting area is located between two adjacent edge-cutting areas, and the first groove is not defined in the edge-cutting areas.

In the display panel provided by an embodiment of the present disclosure, a material of the sacrificial layer comprises an organic photoresist.

An embodiment of the present disclosure further provides a method of manufacturing a display panel, comprising following steps:

providing a to-be-cut display panel, wherein the to-be-cut display panel comprises a display area and a frame area surrounding the display area, the frame area is provided with a corner-cutting area, and a cutting groove is defined on the to-be-cut display panel disposed in the corner-cutting area; and cutting the to-be-cut display panel with respect to a predetermined cutting path, wherein the cutting path corresponds to the cutting groove.

In the manufacturing method provided by an embodiment of the present disclosure, the cutting groove comprises a first opening and a second opening penetrating each other, the first opening is defined in the buffer layer, the second opening is defined in the flexible substrate, and a width of the first opening is less than a width of the second opening.

In the manufacturing method provided by an embodiment of the present disclosure, a depth of the second opening of the cutting groove is less than a thickness of the flexible substrate.

In the manufacturing method provided by an embodiment of the present disclosure, the width of the first opening of the cutting groove is greater than a width of the cutting path.

In the manufacturing method provided by an embodiment of the present disclosure, the width of the first opening of the cutting groove is greater than 100 μm.

In the manufacturing method provided by an embodiment of the present disclosure, the to-be-cut display panel is provided with at least one second groove in the corner-cutting area, the second groove comprises a first opening and a second opening penetrating each other, the first opening is defined in the buffer layer, the second opening is defined in the flexible substrate, and a width of the first opening is less than a width of the second opening.

In the manufacturing method provided by an embodiment of the present disclosure, the width of the first opening of the cutting groove is greater than the width of the first opening of the second groove.

Regarding the beneficial effects: in a display panel and a manufacturing method thereof provided by the present disclosure, a cutting groove is formed in a buffer layer in a corner-cutting area, and an organic sacrificial layer is filled in the cutting groove. Furthermore, a cutting path corresponds to the cutting groove, so that when cutting a to-be-cut display panel, a number of cracks generated due to cutting would be reduced because an organic buffer layer is replaced by the organic sacrificial layer. Moreover, an inorganic encapsulation layer is disposed on an inner wall of the cutting groove, thereby ensuring reliability of an effective encapsulation layer. A width of a second opening at a bottom of the cutting groove is greater than a width of a first opening at a top of the cutting groove. Therefore, cracks at the bottom of the cutting groove are prevented from extending inwardly along the inorganic encapsulation layer and end at an end of the second opening. Furthermore, at least one second groove is formed on the buffer layer, and the second groove further prevents the crack from extending inwardly along the inorganic encapsulation layer, significantly improving an encapsulation effect. In addition, compared to a corner-cutting area, an edge-cutting area of a frame area has a smaller chance to form cracks. Therefore, it is not necessary to define the cutting groove in the edge-cutting area. As a result, manufacturing processes are reduced and simplified, thereby saving costs.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION

Figure 1:
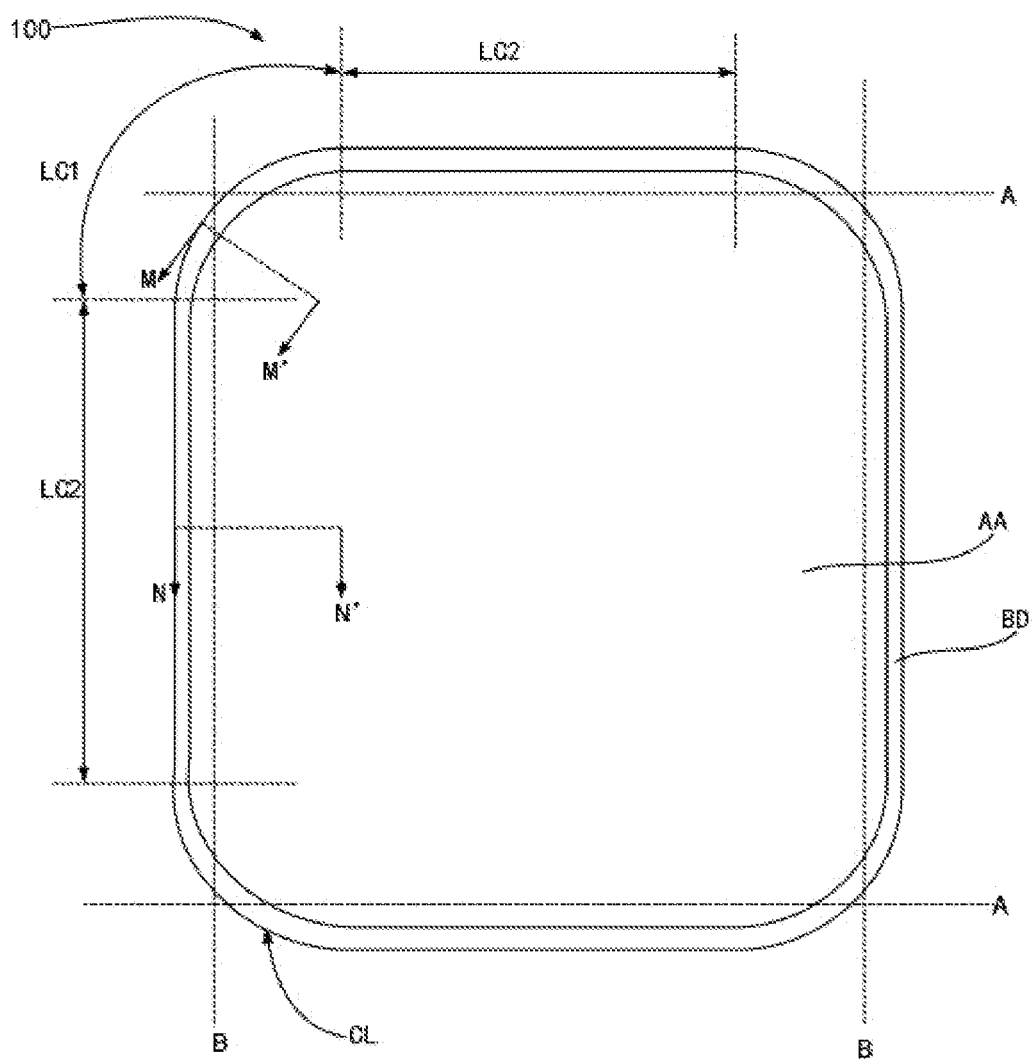
FIG. 1 is a structural schematic top view showing a display panel provided by an embodiment of the present disclosure.

The following description of the various embodiments is provided with reference to the accompanying drawings to demonstrate that the embodiments of the present disclosure may be implemented. However, the described embodiments are only some of the embodiments of the present disclosure, but not all of the embodiments. All other embodiments obtained by those skilled in the art based on the embodiments of the present disclosure without creative efforts are within the scope of the present disclosure.

The following description of the various embodiments is provided with reference to the accompanying drawings. The embodiments described with reference to the attached drawings are all exemplary and are intended to illustrate and interpret the present disclosure. It should be understood that terms such as "top", "bottom", "front", "rear", "left", "right", "inside", "outside", "lateral", as well as derivatives thereof should be construed to refer to the orientation as then described or as shown in the drawings under discussion. These relative terms are for convenience of description, and shall not be construed as causing limitations to the present disclosure. In the drawings, the identical or similar reference numerals constantly denote the identical or similar elements or elements having the identical or similar functions. In the drawings, the thicknesses of some layers and regions are exaggerated for the purpose of understanding and ease of description. The size and thickness of each component shown in the drawings are arbitrarily shown, but the present disclosure is not limited thereto.

Figure 2:
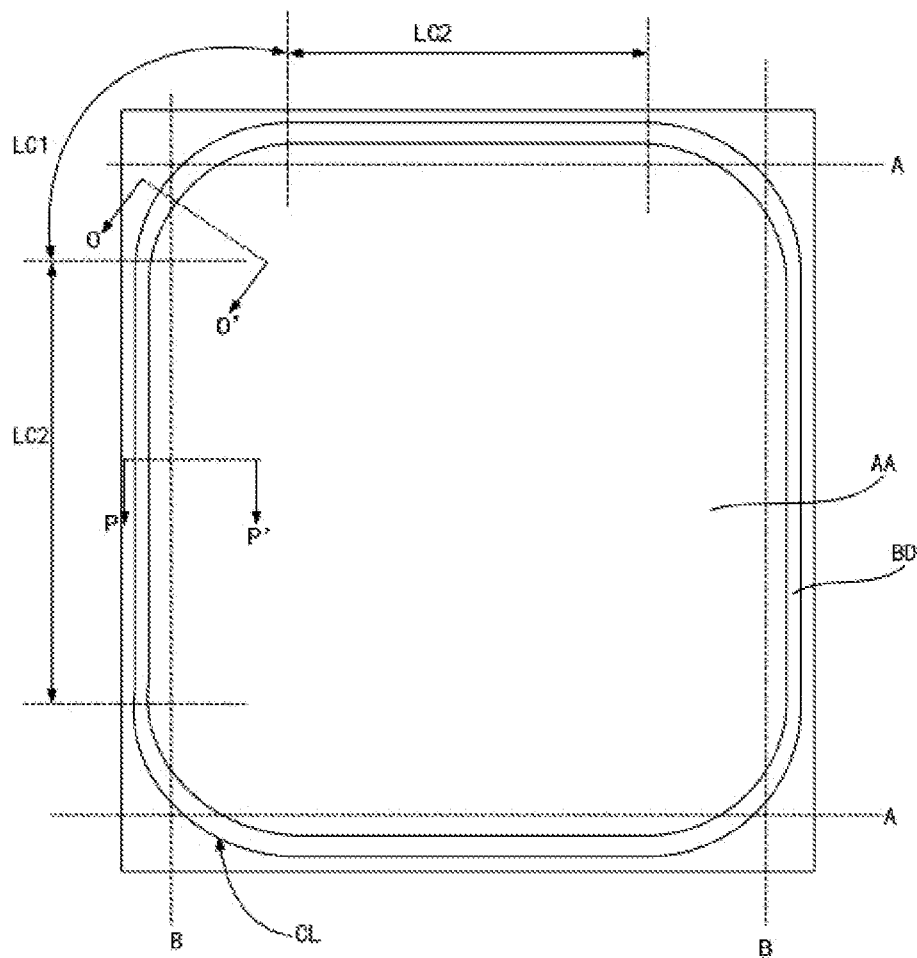
FIG. 2 is a structural schematic top view showing a to-be-cut display panel provided by an embodiment of the present disclosure.

Please refer to FIGS. 1 and 2. FIG. 1 is a schematic top view showing a display panel provided by an embodiment of the present disclosure. FIG. 2 is a schematic top view showing a to-be-cut display panel provided by the embodiment of the application. Generally, in the process of manufacturing a display panel 100, a plurality of display panels are formed on a relatively large support substrate, such as a glass substrate, to form a motherboard, and then the motherboard is cut to form a to-be-cut display panel 200. After that, the support is peeled off, and the to-be-cut display panel 200 is cut a second time to form display panels with different shapes according to actual requirements. In the present disclosure, the display panel 100 is formed by secondary cutting the to-be-cut display panel 200.

Generally, when performing a secondary cutting process, micro-cracks are easy to be formed at a cutting position. In some special-shaped cutting processes, such as cutting a chamfering position of a multi-curved display screen, cracks are easier to be formed. Multi-curved display screen means that at least two sides of the display panel are bent to form curved surfaces. For example, forming a display screen with four curved surfaces requires cutting four rounded chamfers. At the same time, to ensure that a long edge and a short edge of a bending area would not overlap with each other, a large rounded chamfer design is required. Therefore, cutting in a rounded area will be significantly increased, increasing risks of cracks due to cutting. In the present disclosure, the display panel is applied to a curved display screen. Therefore, risks of cracks in a chamfered position of the display panel can be reduced, and the cracks will not extend to the display area of the display panel.

Specifically, please refer to FIG. 1, the display panel 100 includes a display area AA and a frame area BD surrounding the display area AA. The frame area BD is provided with a corner-cutting area LC1 and an edge-cutting area LC2. The corner-cutting area LC1 is located between two adjacent edge-cutting areas LC2. Wherein, in a top view of the display panel 100, the corner-cutting area LC1 is four corner areas of the display panel 100 arranged in an arc-shaped chamfer, and the edge-cutting area LC2 is areas where four edges of the panel 100 are located, wherein the arc-shaped chamfer is formed between every two adjacent edges.

Figure 3:
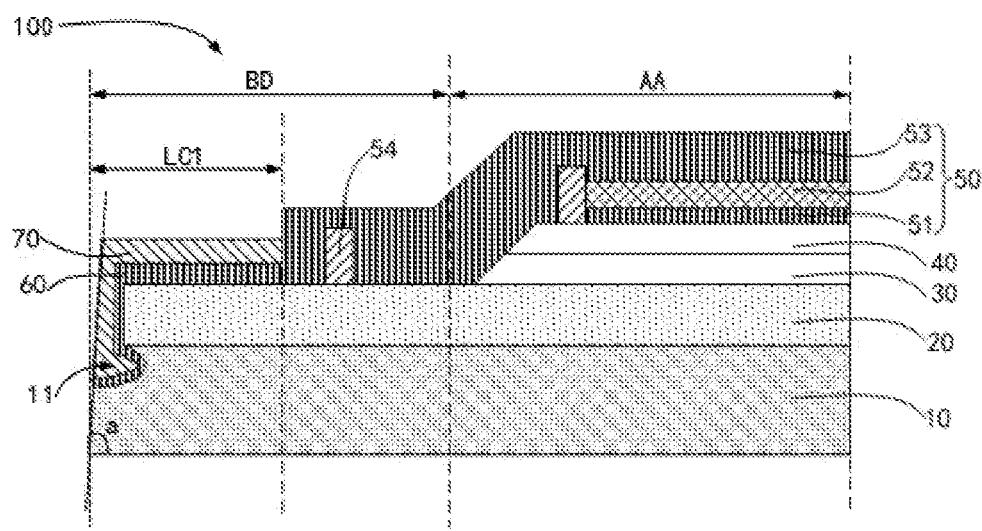
FIG. 3 is a structural schematic cross-sectional view of the display panel in FIG. 1 taken along direction M-M'.
Figure 4:
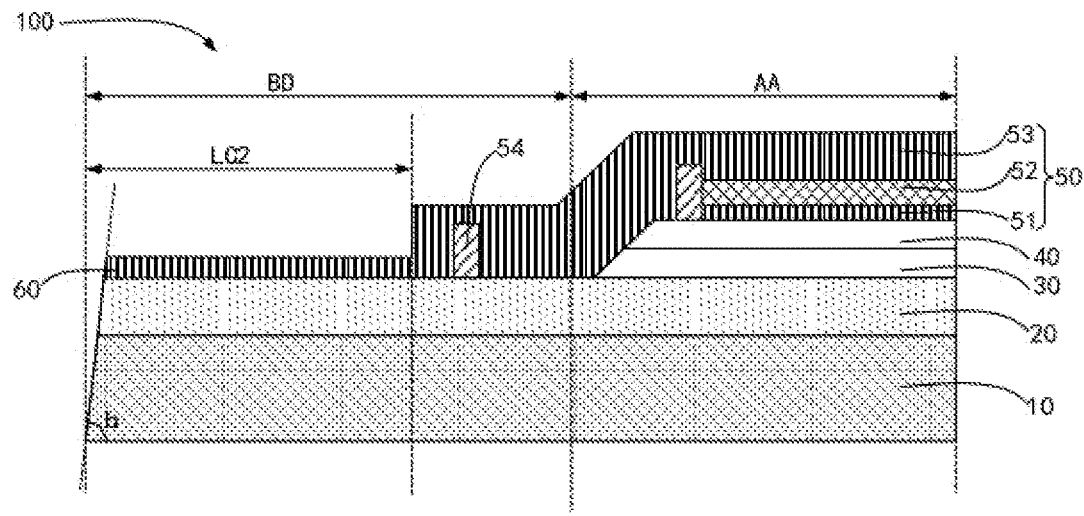
FIG. 4 is a structural schematic cross-sectional view of the display panel in FIG. 1 taken along direction N-N'.

Layer structures in each area of the display panel 100 are described in detail below:

Please refer to FIGS. 3 and 4. FIG. 3 is a structural schematic cross-sectional view showing the display panel in FIG. 1 taken along direction M-M'. FIG. 4 is a structural schematic cross-sectional view showing the display panel in FIG. 1 taken along direction N-N'. The display panel 100 includes a flexible substrate 10 and a buffer layer 20 disposed on the flexible substrate 10. A material of the flexible substrate 10 includes a flexible material such as polyimide (PI). The flexible material can be used to manufacture a substrate, thereby realizing a bendable and rollable flexible display panel. For example, using the flexible display panel to manufacture a multi-curved display screen to achieve a higher screen-to-body ratio.

Optionally, a material of the buffer layer 20 may include an inorganic material such as silicon oxide (SiOx), silicon nitride (SiNx), or silicon oxynitride (SiON). The buffer layer 20 may prevent undesired impurities or pollutants such as moisture and oxygen diffusing from the flexible substrate 10 into devices that may be damaged by these impurities or pollutants. A flat top surface may also be provided.

The display panel 100 includes a driving circuit layer 30, a light-emitting functional layer 40, and an encapsulation layer 50, which are sequentially stacked on the buffer layer 20 in the display area AA. The driving circuit layer 30 includes a plurality of thin-film transistors (TFTs) and a plurality of signal lines, and is configured to provide a driving voltage to the light-emitting function layer 40, thereby allowing a light-emitting device of the light-emitting function layer 40 to emit light.

Figure 5:
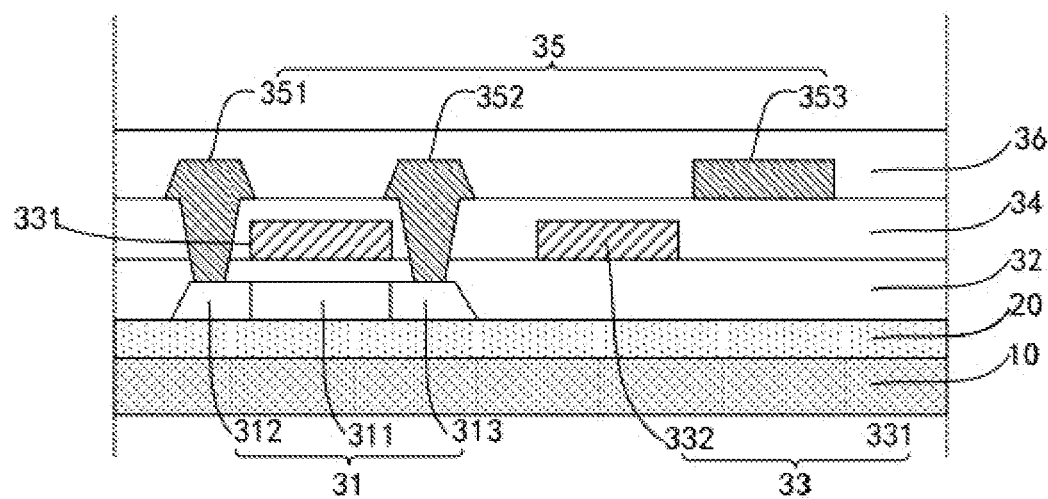
FIG. 5 is a structural schematic cross-sectional view showing layers of a driving circuit layer provided by the embodiment of the present disclosure.

Specifically, please refer to FIG. 5. FIG. 5 is a structural schematic cross-sectional view showing layers of the driving circuit layer provided by the embodiment of the present disclosure. The driving circuit layer 30 includes an active layer 31, a gate insulating layer 32, a gate layer 33, an interlayer insulating layer 34, a source/drain layer 35, and a planarization layer 36, which are sequentially stacked on the buffer layer 20. The active layer 31 includes a channel area 311, and a source doped area 312 and a drain doped area 313 located on two sides of the channel area 311. The gate layer 33 includes a gate 331 and a gate scan line 332, wherein the gate 331 and the channel area 311 correspond to each other. The source/drain layer 35 includes a source electrode 351, a drain electrode 352, and a data signal line 353. The source electrode 351 and the drain electrode 352 respectively pass through a through-hole of the interlayer insulating layer 34 to respectively electrically connect with the source doped area 312 and the drain doped region 313 of the active layer 31. The planarization layer 36 is disposed on the source/drain layer 35, thereby providing a flat top surface for the driving circuit layer 30.

The encapsulation layer 50 may be a thin-film encapsulation and is configured to protect the light-emitting device of the light-emitting functional layer 40 and prevent moisture and oxygen from entering. Therefore, failure of the light-emitting device is prevented. The encapsulation layer 50 may be a stacked structure formed by sequentially laminating three layers of a first inorganic encapsulation layer 51, an organic encapsulation layer 52, and a second inorganic encapsulation layer 53 or by laminating more layers.

A material of the first inorganic encapsulation layer 51 and a material of the second inorganic encapsulation layer 53 include one or more of inorganic substances such as silicon oxide, silicon nitride, and silicon oxynitride. Both the first inorganic encapsulation layer 51 and the second inorganic encapsulation layer 53 can be formed by depositing an inorganic material on the light-emitting functional layer 40 by chemical vapor deposition (CVD), physical vapor deposition (PVD), or atomic layer deposition (ALD).

A material of the organic encapsulation layer 52 includes an organic substance including at least one of epoxy or acrylic. The organic encapsulation layer 52 can be formed on the first inorganic encapsulation layer 51 by a spraying process or a coating process such as inkjet printing (IJP).

The display panel 100 includes an inorganic encapsulation layer 60 disposed on the buffer layer 20 in the frame area BD. The inorganic encapsulation layer 60 is formed by the encapsulation layer 50 extending from the display area AA to the frame area BD. The inorganic encapsulation layer 60 and the buffer layer 20 together form an effective encapsulation area in the frame area BD. The effective encapsulation area is formed by at least two inorganic layers. Of course, the frame area BD also includes other inorganic layers and circuit structures, such as conventional inorganic layers such as a gate insulating layer 32 and an interlayer insulating layer 34. However, in the corner-cutting area LC1 and the edge-cutting area LC2 in the frame area BD, these layers are usually etched to reduce a thickness of the inorganic layers. Only the buffer layer 20 is retained.

It should be understood that when the organic encapsulation layer 52 is formed by inkjet printing, a printed organic material has fluidity. To prevent an ink from overflowing too much, a plurality of barriers 54 need to be disposed on the display panel 100 to block the organic material. Please refer to multiple barriers 54 shown in FIG. 1, the barriers 54 in the display area AA mainly prevent overflow, and the barriers 54 in the frame area BD can also prevent overflow when an ink overflows slightly and can somewhat prevent cracks.

Layer structures of the corner-cutting area LC1 and the edge-cutting area LC2 in the frame area BD are described in detail below.

Please refer to FIG. 3, the display panel 100 includes a flexible substrate 10, a buffer layer 20, an inorganic encapsulation layer 60, and a sacrificial layer 70 in the corner-cutting area LC1. The buffer layer 20 is disposed on the flexible substrate 10, and a length of the buffer layer 20 is less than a length of the flexible substrate 10. Furthermore, a side of an end of the flexible substrate 10 near the buffer layer is provided with a first groove 11. A bottom of the first groove 11 extends toward the display area AA. An end of the flexible substrate 10 is an end portion of the flexible substrate 10 extending from the display area AA to the frame area BD. The inorganic encapsulation layer 60 is disposed on a top surface and a lateral surface of the buffer layer 20 and the first groove 11. The top surface of the buffer layer 20 is a side of the buffer layer 20 away from the flexible substrate 10, and the lateral surface of the buffer layer 20 is perpendicular to the top surface of the buffer layer and is away from the display area AA.

Specifically, in the corner-cutting area LC1, a length of the buffer layer 20 is less than a length of the flexible substrate 10. That is, a horizontal distance from an end of the buffer layer 20 to the display area AA is less than a horizontal distance from an end of the flexible substrate 10 to the display area AA. Therefore, the inorganic encapsulation layer 60 can smoothly extend from the lateral surface of the buffer layer 20 into the first groove.

The bottom of the first groove 11 extends toward the display area AA. That is, an opening direction of the first groove 11 is away from the display area AA. Furthermore, an opening of the first groove 11 is aligned with a surface of the end of the flexible substrate 10. As such, when cutting the to-be-cut display panel 200 to form the display panel 100, even if some cracks due to cutting are generated, the cracks due to cutting will likely end at the first groove 11 and will not extend toward the display area AA. Optionally, a cross-sectional shape of the first groove 11 includes a circular arc, but is not limited thereto. The cross-sectional shape of the first groove 11 specifically depends on a cross-sectional shape of a cutting groove 21 of the to-be cut display panel 200.

The inorganic encapsulation layer 60 is disposed on the top surface and the lateral surface of the buffer layer 20 and on the first groove 11. The inorganic encapsulation layer 60 and the buffer layer 20 together form an effective encapsulation area at the corner-cutting area LC1 to ensure encapsulation reliability of the frame area BD of the display panel 100.

The inorganic encapsulation layer 60 includes at least one of a first inorganic encapsulation layer 51 or a second inorganic encapsulation layer 53. Of course, when the inorganic encapsulation layer 60 includes both the first inorganic encapsulation layer 51 and the second inorganic encapsulation layer 53, reliability of the encapsulation is higher. To reduce the cracks generated in the inorganic layer during a cutting process, a thickness of the inorganic encapsulation layer 60 needs to be reduced. Therefore, a thickness of an inorganic encapsulation in the corner-cutting area LC1 is less than the thickness of the inorganic encapsulation layer 60 in other areas of the frame area BD. Furthermore, a thickness of the inorganic encapsulation layer 60 in the corner-cutting area LC1 and a thickness of the inorganic encapsulation layer 60 on the buffer layer 20 are equal to a thickness of the inorganic encapsulation layer 60 in the first groove 11.

The sacrificial layer 70 is disposed on the inorganic encapsulation layer 60 in the first groove 11 and fills the first groove 11. Optionally, the sacrificial layer 70 covers the inorganic encapsulation layer 60 in the first groove 11 and on the buffer layer 20. Of course, the sacrificial layer 70 may also not cover the inorganic encapsulation layer 60 on the buffer layer 20, and it may only cover the inorganic encapsulation layer 60 in the first groove 11 and fill the cutting groove 21. A material of the sacrificial layer 70 includes an organic material such as organic photoresist.

It should be noted that a specific coverage of the sacrificial layer 70 depends on an area of the sacrificial layer 70 in the corner-cutting area LC1 of the to-be-cut display panel 200 and a cutting method used to cut the to-be-cut display panel 200.

Please refer to FIG. 4, the display panel 100 includes the flexible substrate 10, the buffer layer 20, and the inorganic encapsulation layer 60 in the edge-cutting area LC2. The buffer layer 20 is disposed on the flexible substrate 10, and the inorganic encapsulation layer 60 is disposed on the buffer layer 20. The first groove and the sacrificial layer are not formed in the edge-cutting area LC2.

Figure 6:
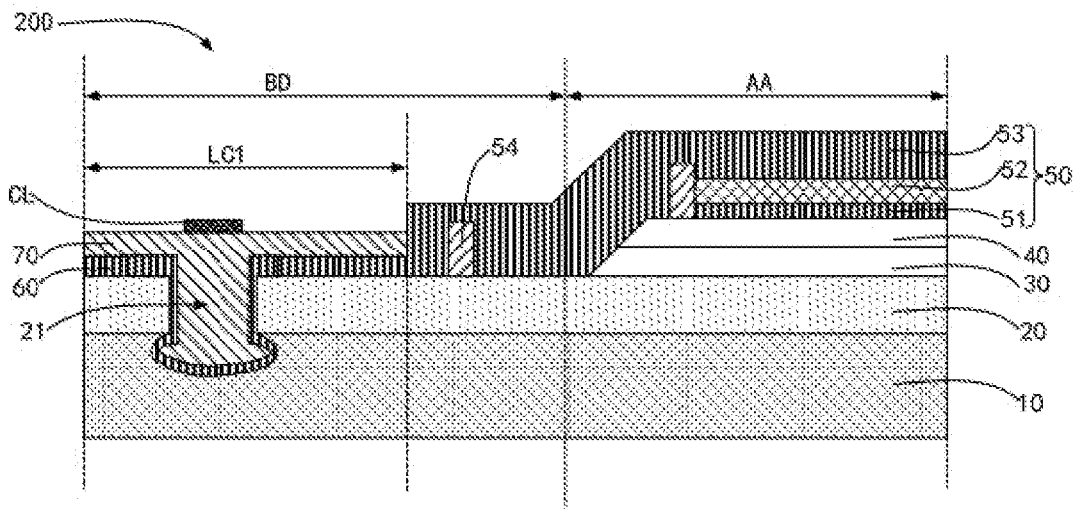
FIG. 6 is a structural schematic cross-sectional view showing the to-be-cut display panel in FIG. 2 taken along direction θ-0'.
Figure 7:
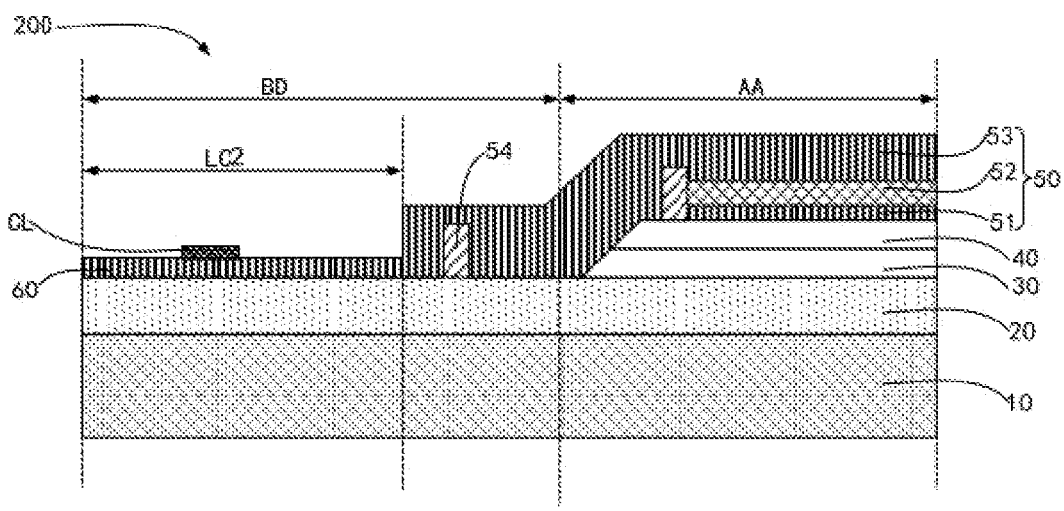
FIG. 7 is a structural schematic cross-sectional view showing the to-be-cut display panel in FIG. 2 taken along direction P-P'.
Figure 8:
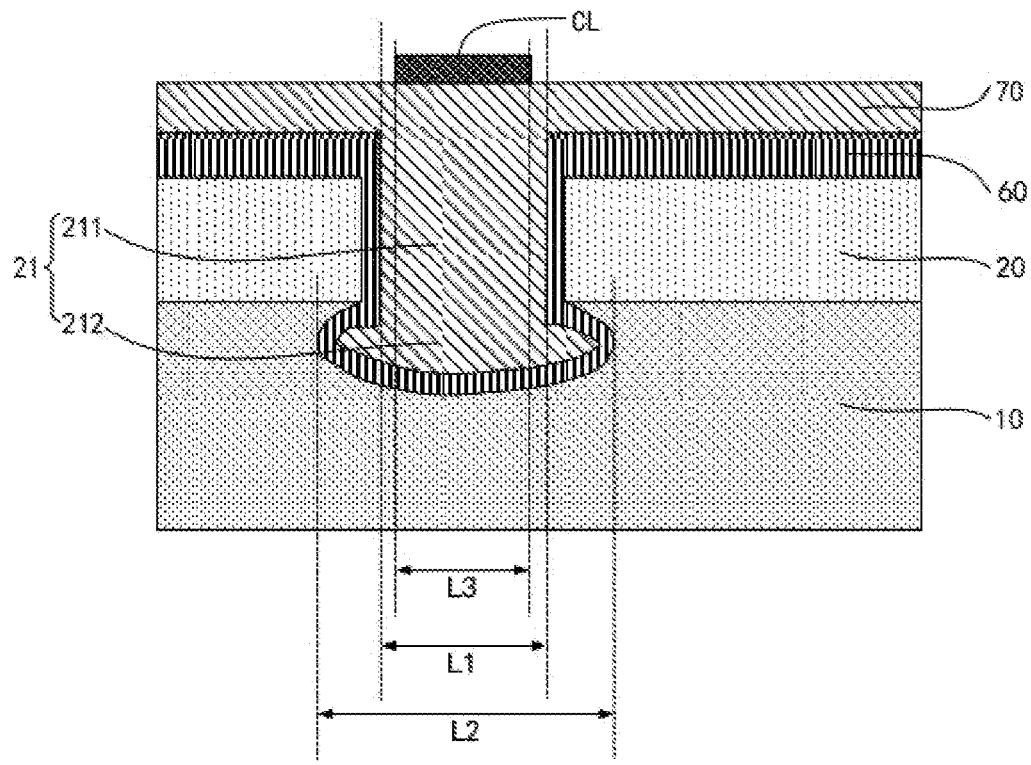
FIG. 8 is a schematic view showing details of a cutting groove on the to-be-cut display panel provided by the embodiment of the present disclosure.

Hereinafter, a method to obtain the display panel 100 from the to-be-cut display panel 200 will be described in detail with reference to FIGS. 1 to 8. FIG. 6 is a structural schematic cross-sectional view showing the to-be-cut display panel in FIG. 2 taken along direction O-O'. FIG. 7 is a structural schematic cross-sectional view showing the to-be-cut display panel taken along direction P-P'. FIG. 8 is a schematic view showing details of the cutting groove on the to-be-cut display panel provided by the embodiment of the present disclosure.

The to-be-cut display panel 200 includes the display area AA and the frame area BD surrounding the display area AA. The frame area BD is provided with the corner-cutting area LC1 and the edge-cutting area LC2. The corner-cutting area LC1 and the edge-cutting area LC2 are provided with a predetermined cutting line CL, wherein the predetermined cutting line CL in the corner-cutting area LC1 is a curve, the predetermined cutting line CL in the edge-cutting area LC2 is a straight line. The predetermined cutting line CL is also the cutting path during a cutting process. A width of the predetermined cutting line CL is also a width of the cutting path. The predetermined cutting line CL may be a virtual marking line or may be composed of multiple mark points in the corner-cutting area LC1 and the edge-cutting area LC2, but is not limited thereto. The predetermined cutting line CL in the present embodiment is a virtual line. However, the predetermined cutting line CL illustrated in the present embodiment is only to help illustrate a position of the cutting path, and it does not exist in an actual situation. The to-be-cut display panel 200 is cut along the predetermined cutting line CL to form the display panel 100 as shown in FIG. 1.

Specifically, referring to FIG. 6, the to-be-cut display panel 200 includes the display area AA and the frame area BD surrounding the display area AA. The frame area BD is provided with the corner-cutting area LC1, and the to-be-cut display panel 200 includes the flexible substrate 10, the buffer layer 20, the inorganic encapsulation layer 60, and the sacrificial layer 70 in the corner-cutting area LC1. The buffer layer 20 is disposed on the flexible substrate 10, and the buffer layer 20 is provided with the cutting groove 21. The inorganic encapsulation layer 60 is disposed on the buffer layer 20 and in the cutting groove 21. The sacrificial layer 70 is disposed on the inorganic encapsulation layer 60 in the cutting groove 21 and fills the cutting groove 21. The cutting groove 21 penetrates the buffer layer 20 and extends into the flexible substrate 10, and the cutting path of the corner-cutting area LC1 corresponds to the cutting groove 21.

The cutting groove 21 penetrates the buffer layer 20 and extends into the flexible substrate 10, and the predetermined cutting line CL of the corner-cutting area LC1 corresponds to the cutting groove 21. The cutting groove 21 may be formed by etching the buffer layer 20 after the driving circuit layer 30 is formed, thereby preventing inorganic layers of the driving circuit layer 30 from being deposited in the cutting groove 21, which increases difficulty of etching the inorganic layer in the corner-cutting area LC1.

The cutting groove 21 includes a first opening 211 and a second opening 212, the first opening 211 is on a top, and the second opening 212 is on a bottom. The first opening 211 and the second opening 212 are connected to each other. That is, the first opening 211 and the second opening 212 pass through each other. The first opening 211 is located in the buffer layer 20, and the second opening 212 is located in the flexible substrate 10.

An orthographic projection of the second opening 212 on the flexible substrate 10 covers and is larger than an orthographic projection of the first opening 211 on the flexible substrate 10. That is, the orthographic projection of the first opening 211 on the flexible substrate 10 is within the orthographic projection of the second opening 212 on the flexible substrate 10. A width L1 of the first opening 211 is less than a width L2 of the second opening 212. The width L1 of the first opening 211 needs to be greater than a width L3 of the predetermined cutting line CL. For example, during a laser cutting process, the width L1 of the first opening 211 needs to be greater than a width of a laser cutting path, and the width L1 of the first opening 211 is set to be greater than 100 microns. The cutting path is a slit left after the laser cutting process. The width of the slit may be equal to the width L3 of the predetermined cutting line CL. The width in the present disclosure is in a direction perpendicular to an extending direction of the predetermined cutting line CL in a same horizontal plane.

When forming the cutting groove 21, the buffer layer 20 is etched first to form the first opening 211, wherein a centerline of the first opening 211 overlaps with the predetermined cutting line CL. Then, the flexible substrate 10 is etched to form the second opening 212, and a centerline of the second opening 212 overlaps with the predetermined cutting line CL. The buffer layer 20 and the flexible substrate 10 can be etched by a dry etching method such as plasma etching. Because of a difference in materials of the buffer layer 20 and the flexible substrate 10, the flexible substrate 10 is easier to be etched under a same energy and a same ion density. Therefore, an etched width of the flexible substrate 10 is greater than the width of the buffer layer 20. That is, the width L2 of the second opening 212 is greater than the width L1 of the first opening 211. In addition, the second opening 212 is formed in the flexible substrate 10, and the flexible substrate 10 is the lowest layer of the display panel 100. Therefore, a depth of the second opening 212 is less than a thickness of the flexible substrate 10. Finally, a cross-sectional shape of the cutting groove 21 is convex.

At the same time, a cross-sectional shape of the second opening 212 includes rectangular or circular arc. As shown in FIG. 5, the cross-sectional shape of the second opening 212 is multi-segment arc. When dry etching is performed to form the second opening 212, gas diffuses uniformly during etching. A result of etching is that an etching interface is very smooth, resembling an arc.

It should be understood that because the cross-sectional shape of the second opening 212 is multi-segment arc, the cross-sectional shape of the first groove 11 of the display panel 100 formed by cutting the to-be-cut display panel 200 is an arc. That is, the first groove 11 is a retained part of the cutting groove 21 after the cutting groove is cut.

Furthermore, the sacrificial layer 70 is filled in the cutting groove 21 and covers the inorganic encapsulation layer 60 in the cutting groove 21 and on the buffer layer 20. The sacrificial layer 70 fills the entire cutting groove 21. Of course, the sacrificial layer 70 may also not cover the inorganic encapsulation layer 60 on the buffer layer 20, but only cover the inorganic encapsulation layer 60 in the cutting groove 21 and fill the cutting groove 21. A material of the sacrificial layer 70 includes an organic material such as organic photoresist. Filling the sacrificial layer 70 in the cutting groove 21 needs to be performed after a packaging process of the display panel 100 is completed. For example, when a touch functional layer is formed on the packaging layer 50, the cutting groove 21 is simultaneously filled with an organic layer of the touch functional layer.

Furthermore, please refer to FIG. 7, the to-be-cut display panel 200 includes the flexible substrate 10, the buffer layer 20, and the inorganic encapsulation layer 60 in the edge-cutting area LC2. The buffer layer 20 is disposed on the flexible substrate 10, and the inorganic encapsulation layer 60 is disposed on the buffer layer 20. The cutting groove and the sacrificial layer are not formed in the edge-cutting area LC2.

The display panel 100 can be formed by cutting the to-be-cut display panel 200 along a predetermined cutting path. Optionally, the to-be-cut display panel 200 can be cut by a laser to form the display panel 100. When cutting the to-be-cut display panel 200, the to-be-cut display panel 200 is provided with four corner-cutting areas LC1. That is, four rounded chamfers need to be cut. For four-curved-surface display screens which need to form four curved surfaces, four edges of the to-be-cut display panel 200 need to be bent along a horizontal bending line A and a vertical bending line B. Furthermore, to prevent interference between the four edges during bending, a larger rounded chamfer is required, which increases a cutting path and further increases probability of cracks. However, the to-be-cut display panel 200 is provided with the cutting groove 21 in the corner-cutting areas LC1, and the organic sacrificial layer 70 is filled in the cutting groove 21. Moreover, the predetermined cutting line CL corresponds to the cutting groove 21. Therefore, the organic sacrificial layer 70 replaces the inorganic buffer layer 20 in a position to be cut, reducing cracks generated during cutting.

In addition, an inorganic encapsulation layer 60 is deposited on an inner wall of the cutting groove 21, thereby ensuring reliability of the effective encapsulation area. A width of the second opening 212 at a bottom of the cutting groove 21 is greater than a width of the first opening 211 at a top, thereby preventing cracks generated on the inorganic encapsulation layer 60 at the bottom of the cutting groove 21 from extending to an inner surface along the inorganic encapsulation layer 60. The cracks end at an end of the second opening 212. The end of the second opening 212 is an ending position of an extending in a direction parallel to the flexible substrate 10.

In addition, when cutting the edge-cutting area LC2 of the to-be-cut display panel 200, the predetermined cutting line CL of the edge-cutting area LC2 is a straight line. Risks of cracks when cutting along a straight line are relatively small compared with risks of cracks when cutting along a curved line. Furthermore, due to limitation of laser cutting, an actual cutting path when cutting along a curved line is usually a polyline instead of a smooth curve, increasing probability of risks of cracks. Therefore, the to-be-cut display panel 200 of the present disclosure does not have the cutting groove and the sacrificial layer in the edge-cutting area LC2. As such, a packaging reliability of the to-be-cut display panel 200 is not affected, and manufacturing processes of the edge-cutting area LC2 can be simplified. As a result, process difficulty is reduced and costs are saved.

It should be noted that when cutting the to-be-cut display panel 200, due to limitation of a cutting process, a surface of the display panel 100 after being cut may not be ideally flat. For example, during a laser cutting process, in the corner-cutting area LC1, the laser starts to cut from the sacrificial layer 70 toward the flexible substrate 10. Due to a high temperature ablation caused by the laser, a width of a cutting path in the start is slightly greater than a width of the cutting path in the end, leading to an inclined surface of the display panel 100. Please refer to the display panel 100 as shown in FIG. 3, an included angle a between a lateral surface of the flexible substrate 10 and a bottom surface of the flexible substrate 10 is less than 90 degrees. Optionally, the included angle a may range from 70 degrees to 80 degrees. Correspondingly, a cutting surface of the display panel 100 formed in the edge-cutting area LC2 after a cutting process is also an inclined surface. As shown in the display panel 100 in FIG. 4, an included angle between a lateral surface of the flexible substrate 10 and a bottom surface of the flexible substrate 10 is less than 90 degrees. Optionally, the included angle b may range from 70 degrees to 80 degrees. Wherein, the included angle a and the included angle b may be equal. Of course, the present disclosure is not limited thereto. In an idea cutting process without considering a limitation of the cutting process, the cutting surface of the display panel 100 may also be a flat surface. Therefore, the lateral surface of the flexible substrate 10 is perpendicular to the bottom surface of the substrate 10.

It can be understood that the edge-cutting area LC2 may also not exist. For example, the frame area BD corresponding to the edge-cutting area LC2 is an actual required frame area. In this case, the frame area BD is not necessary to be cut.

Figure 9:
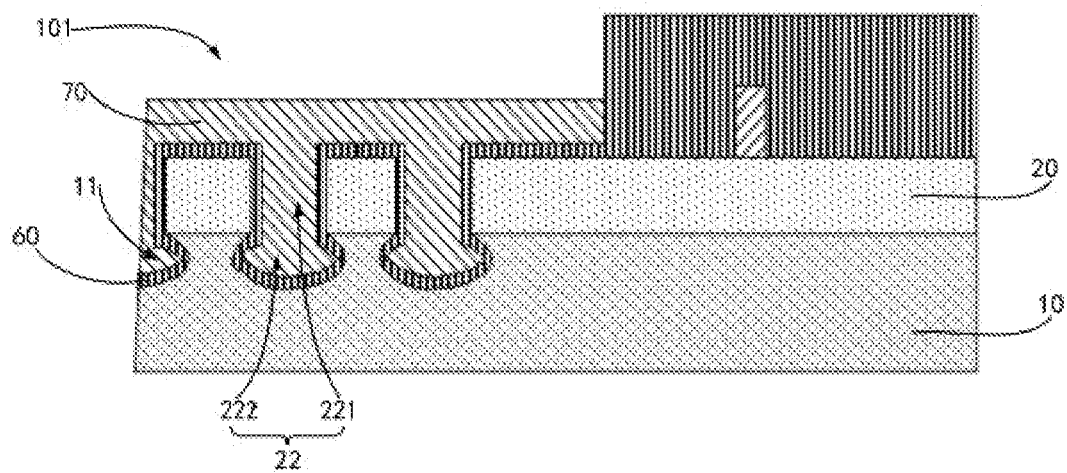
FIG. 9 is another structural schematic cross-sectional view showing the display panel provided by the embodiment of the present disclosure.
Figure 10:
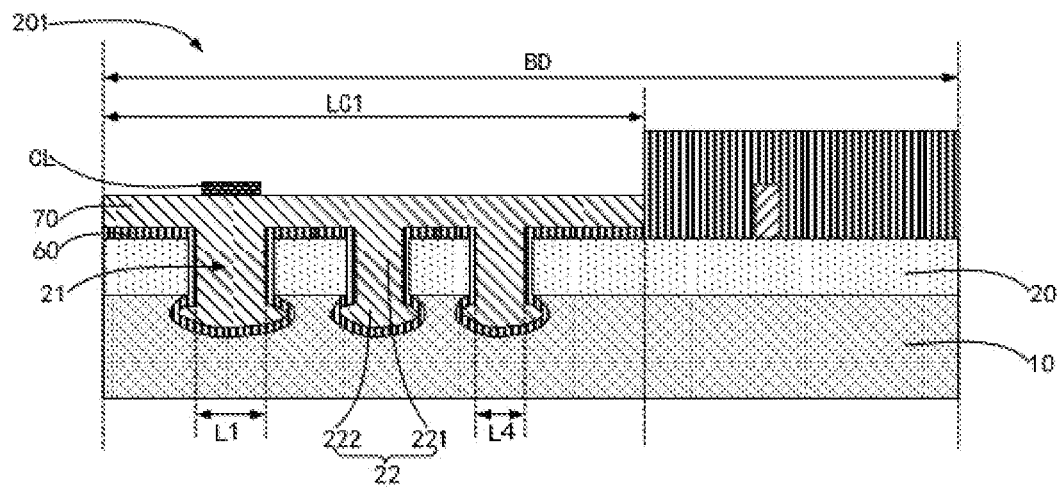
FIG. 10 is another structural schematic cross-sectional view showing the to-be-cut display panel provided the embodiment of the present disclosure.

In one embodiment, please refer to FIGS. 8 to 10. FIG. 9 is another structural schematic cross-sectional view showing the display panel provided by an embodiment of the present disclosure. FIG. 10 is another structural schematic view showing the to-be-cut display panel provided by an embodiment of the present disclosure. A difference from the foregoing embodiment is that the buffer layer 20 of the display panel 101 is further provided with at least one second groove 22 which penetrates the buffer layer 20 and extends to the flexible substrate 10. Furthermore, the inorganic encapsulation layer 60 is disposed in the second groove 22.

Specifically, the second groove 22 includes a first opening 221 and a second opening 222 which penetrate each other. The first opening 221 is located in the buffer layer 20, and the second opening 222 is located inside the flexible substrate 10. A width of the first opening 221 is less than a width of the second opening 222.

Optionally, an extending end of the first groove 11 and an extending end of the second opening 222 of the second groove 22 are on a same horizontal plane. The extending end of the first groove 11 and the extending end of the second opening 222 of the second groove 22 are ending positions of an extending direction parallel to the flexible substrate 10.

Furthermore, an interval is defined between the first groove 11 and the second groove 22 to prevent the extending ends the first groove 11 and the second groove 22 from contacting, which affects an anti-crack extending effect when the to-be-cut display panel 201 is cut.

Please refer to FIG. 10, the to-be-cut display panel 201 is also provided with the second groove 22. A depth of the second groove 22 is equal to a depth of the cutting groove 21, and a width L1 of the first opening 211 of the cutting groove 21 is greater than a width L4 of the first opening 221 of the second groove 22.

Specifically, the second groove 22 and the cutting groove 21 are simultaneously formed in same process conditions. A number of the second groove 22 may be 1 to 7. FIG. 10 schematically shows two second grooves 22. Each of the second grooves 22 also includes the first opening 221 and the second opening 222. The first opening 221 is located in the buffer layer 20, and the second opening 222 is located in the flexible substrate 10. The width L1 of the first opening 211 of the cutting groove 21 is greater than the width L4 of the first opening 221 of the second groove 22, and the width of the second opening 212 of the cutting groove 21 is greater than the width of the second opening 221. Furthermore, the width of the first opening 221 of the second groove 22 is less than the width of the second opening 222 of the second groove 22. That is, the entire width of the second groove 22 is less than the entire width of the cutting groove 21.

The depth of the second groove 22 is equal to the depth of the cutting groove 21. Since both the second groove 22 and the cutting groove 21 penetrate the buffer layer 20 of a same thickness, the depth of the first opening 211 of the cutting groove 21 and the depth of the first opening 221 of the second groove 22 are same. Therefore, the depth of the second opening 212 of the cutting groove 21 and the depth of the second opening 222 of the second groove 22 are also same. A cross-sectional shape of the second opening 222 of the second groove 22 also includes rectangular or arc. As shown in FIG. 10, the cross-sectional shape of the second opening 222 of the second groove 22 is multi-segment arc.

An inner wall and a bottom of the second groove 22 are also covered with the inorganic encapsulation layer 60. The second groove 22 is also filled with the sacrificial layer 70, which covers the inorganic encapsulation layer 60 and fills the entire second groove 22. The second groove 22 has the same special structure design as the cutting groove 21. When a crack extends inside a surface from the cutting groove 21, the crack ends at the end of the second opening 222 of the second groove 22 when it reaches the second groove 22. Therefore, cracks are prevented from extending inwardly. The sacrificial layer 70 filled in the second groove 22 can flatten a top surface of the corner-cutting area LC1 and prevent foreign matter from entering the second groove 22 and causing pollution. Of course, since the second groove 22 will not be cut, the sacrificial layer 70 may also not be filled in the second groove 22. Other descriptions can be referred to other embodiments and area not described here again.

Figure 11:
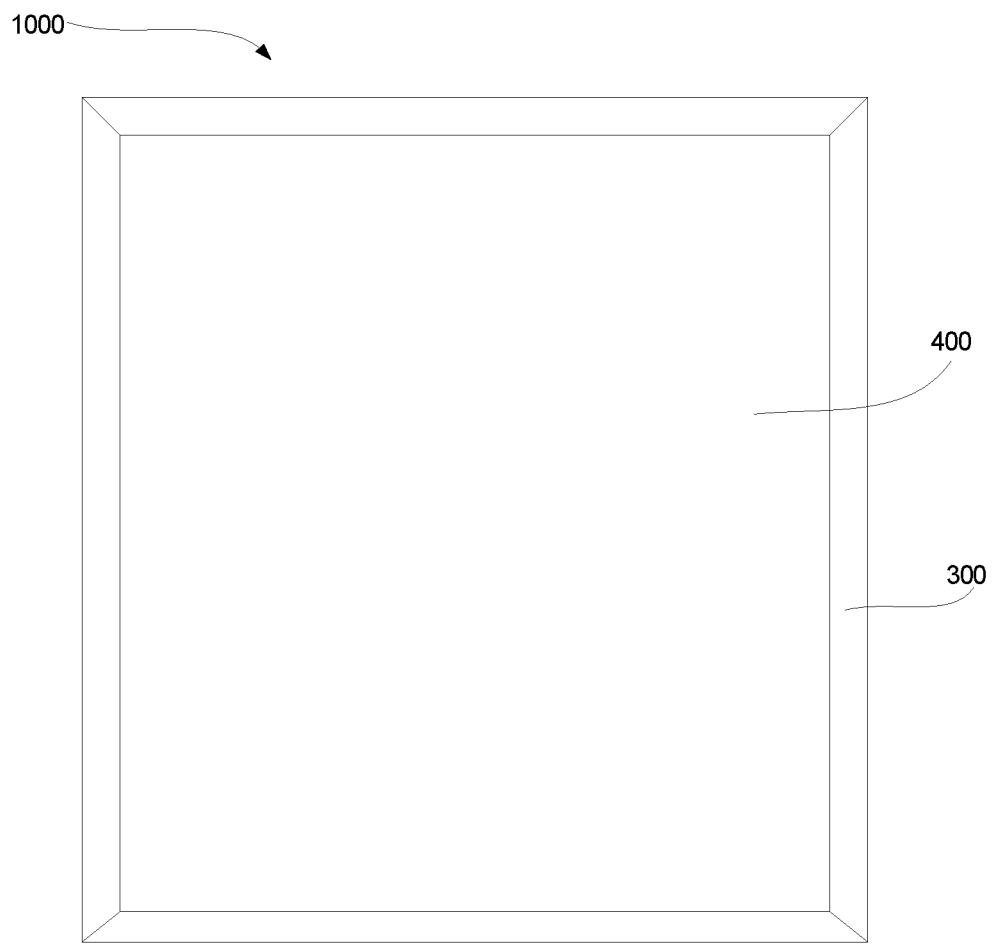
FIG. 11 is a structural schematic top view showing a curved display screen provided by an embodiment of the present disclosure.

An embodiment of the present application furthermore provides a curved display screen formed by bending the frame area of the display panel according to one of the above-mentioned embodiments. Specifically, please refer to FIGS. 1 to 7 and FIG. 11. FIG. 11 is a schematic top view showing the curved display screen provided by the embodiment of the present disclosure. Optionally, a curved display screen 1000 is formed by bending the frame area of the display panel 100 in the above-mentioned embodiments.

Specifically, the to-be-cut display panel 200 is cut along the predetermined cutting line CL. The cutting line CL is located at a corner of the to-be-cut display panel 200. That is, the cutting line CL corresponds to the cutting groove 21. Furthermore, the sacrificial layer 70 is filled in the cutting groove 21, thereby reducing cracks generated during a cutting process and allowing the crack to end at the end of the bottom of the cutting groove 21.

The to-be-cut display panel 200 is cut along the predetermined cutting line CL to form the display panel 100. Then, four edges of the display panel 100 are bent along a horizontal bending line A and a vertical bending line B to form the curved display screen 1000 as shown in FIG. 11. In the curved display screen 1000, four curved surfaces 300 surround a flat display area 400 and are end-to-end connected to each other.

It should be understood that the width of the first opening 211 of the cutting groove 21 is greater than a width of a cutting path of a cutting member. As such, after the to-be-cut display panel 200 is cut, part of the cutting groove 21 and the sacrificial layer 70 and the inorganic encapsulation layer 60 in the cutting groove 21 will be retained. After the frame area of the display panel 100 is bent to form the curved display screen 1000, these residual structures will be part of the curved display screen 1000.

Figure 12:
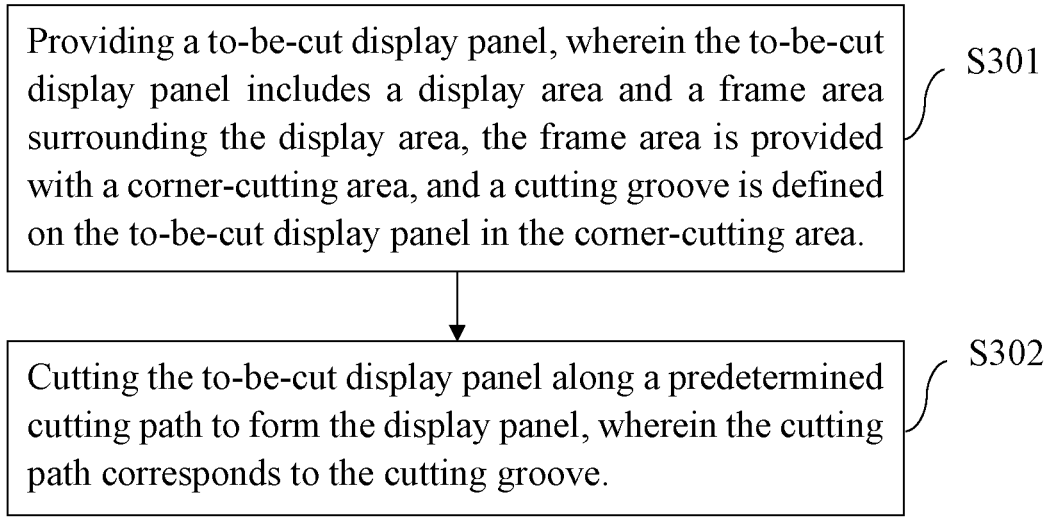
FIG. 12 is a schematic flowchart showing a method of manufacturing a display panel provided by an embodiment of the present disclosure.

An embodiment of the present application further provides a method of manufacturing a display panel of one of the above-mentioned embodiments. Specifically, please refer to FIGS. 1 to 10 and FIG. 12. FIG. 12 is a schematic flowchart showing the method of manufacturing the display panel according to the embodiment of the present disclosure. The manufacturing method of the display panel includes following steps:

S301: providing a to-be-cut display panel, wherein the to-be-cut display panel includes a display area and a frame area surrounding the display area, the frame area is provided with a corner-cutting area, and a cutting groove is defined on the to-be-cut display panel in the corner-cutting area.

Specifically, a to-be-cut display panel 201 includes a display area AA and a frame area BD surrounding the display area AA. The frame area BD is provided with a corner-cutting area LC1 and an edge-cutting area LC2. The cutting area LC1 is located between two adjacent edge-cutting areas LC2. It should be noted that a difference between the to-be-cut display panel 201 and the to-be-cut display panel 200 is a structure of the corner-cutting area LC1. However, top views of them are same. Therefore, the to-be-cut display panel 201 described in the present embodiment can be referred to the to-be-cut display panel 200 as shown in FIG. 2.

In the corner-cutting area LC1, the to-be-cut display panel includes a flexible substrate 10, a buffer layer 20, an inorganic encapsulation layer 60, and a sacrificial layer 70. The buffer layer 20 is disposed on the flexible substrate 10 and is provided with a cutting groove 21 and at least one second groove 22. The inorganic encapsulation layer 60 is disposed on the buffer layer 20 and in the cutting groove 21 and the second groove 22. The sacrificial layer 70 is disposed on the inorganic encapsulation layer 60 in the cutting groove 21 and the second groove 22 and fills the cutting groove 21 and the second groove 22. Wherein, the cutting groove 21 and the second groove 22 penetrate the buffer layer 20 and extend into the flexible substrate 10. A cutting path of the corner-cutting area LC1 corresponds to the cutting groove 21.

The cutting groove 21 and the second groove 22 each includes a first opening and a second opening which penetrate each other. The first opening is located in the buffer layer, and the second opening is located in the flexible substrate. A width of the first opening is less than a width of the second opening.

The width of the first opening 211 of the cutting groove 21 is greater than a width of the cutting path. Optionally, the width of the first opening 211 of the cutting groove 21 is greater than 100 nm.

Layer structures of the to-be-cut display panel 201 in the edge-cutting area LC2 can be referred to FIG. 7 and the description of the layer structures of the to-be-cut display panel 200 in the edge-cutting area LC2 of the above-mentioned embodiments, and are not described again here.

S302: cutting the to-be-cut display panel along a predetermined cutting path to form the display panel, wherein the cutting path corresponds to the cutting groove.

Specifically, the corner-cutting area LC1 of the to-be-cut display panel 201 is cut along a predetermined cutting line CL to form the display panel 101 as shown in FIG. 9. The cutting line CL is located in the corner-cutting area LC1 of the cutting groove 21 of the to-be-cut display panel in the cutting groove 21. That is, the cutting line CL corresponds to the cutting groove 21. The cutting groove 21 is filled with the sacrificial layer 70, thereby reducing cracks generated in the corner-cutting area during a cutting process. The cracks end at an end of a bottom of the cutting groove 21. A cutting process performed on the edge-cutting area LC2 of the to-be-cut display panel 201 can be referred to the description of the cutting process performed on the edge-cutting area LC2 of the to-be-cut display panel 200 of the above-mentioned embodiment, and is not described again here.

In the above embodiments, the focus of each embodiment is different, and for a part that is not detailed in an embodiment, reference may be made to related descriptions of other embodiments.

Embodiments of the present disclosure have been described in detail, which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A display panel, comprising a display area and a frame area surrounding the display area, wherein the frame area is provided with a corner-cutting area, and the display panel comprises:
   a flexible substrate, wherein a first groove is defined in the flexible substrate, the first groove is located at an edge of the corner-cutting area away from the display area, and a side wall of the first groove is a semi-closed structure;
   a buffer layer disposed on the flexible substrate;
   an inorganic encapsulation layer disposed on an upper surface and a lateral surface of the buffer layer and disposed in the first groove; and
   a sacrificial layer disposed on the inorganic encapsulation layer in the first groove and filling the first groove;
   wherein a length of a part of the buffer layer located in the corner cutting area is less than a length of a part of the flexible substrate located in the corner-cutting area.

2. The display panel of claim 1, wherein the sacrificial layer is further disposed on the inorganic encapsulation layer on the lateral surface of the buffer layer.

3. The display panel of claim 2, wherein an angle between a lateral surface of the flexible substrate and a lower surface of the flexible substrate is less than 90 degrees.

4. The display panel of claim 3, wherein the angle between the lateral surface of the flexible substrate and the lower surface of the flexible substrate is greater than 80 degrees.

5. The display panel of claim 1, wherein a cross-sectional shape of the first groove comprises arc.

6. The display panel of claim 1, wherein the buffer layer is further provided with at least one second groove, the second groove penetrates the buffer layer and extends to the flexible substrate, and the inorganic encapsulation layer is further disposed in the second groove.

7. The display panel of claim 6, wherein an interval is defined between the first groove and the second groove.

8. The display panel of claim 6, wherein the frame area is further provided with a plurality of edge-cutting areas, and the corner-cutting area is located between two adjacent edge-cutting areas, and the first groove is not defined in the edge-cutting areas.

9. The display panel of claim 6, wherein the second groove comprises a first opening and a second opening penetrating each other, the first opening is defined in the buffer layer, the second opening is defined in the flexible substrate, and a width of the first opening is less than a width of the second opening.

10. The display panel of claim 9, wherein a depth of the second opening is less than a thickness of the flexible substrate.

11. The display panel of claim 9, wherein a cross-sectional shape of the second opening comprises rectangular and arc.

12. The display panel of claim 9, wherein an extending end of the first groove and an extending end of the second opening are on a same horizontal plane.

13. The display panel of claim 1, wherein a material of the sacrificial layer comprises an organic photoresist.

14. The display panel of claim 1, wherein a part of the inorganic encapsulation layer located in the first groove is in contact with a bottom wall of the first groove, the upper surface and the lateral surface of the buffer layer.

15. The display panel of claim 1, wherein an end of the buffer layer away from the display area is closer to the display area compared to an end of the flexible substrate away from the display area.

16. The display panel of claim 15, wherein an opening direction of the first groove is away from the display area.

17. The display panel of claim 1, wherein a thickness of a part of the inorganic encapsulation layer located in the corner-cutting area is less than a thickness of a part of the inorganic encapsulation layer located in another area of the frame area.

18. The display panel of claim 1, wherein a depth of the first groove along a thickness direction of the display panel is less than a thickness of the flexible substrate.

19. A display panel, comprising a display area and a frame area surrounding the display area, wherein the frame area is provided with a corner-cutting area, and the display panel comprises:
a flexible substrate, wherein a first groove is defined in the flexible substrate, the first groove is located at an edge of the corner-cutting area away from the display area, and a side wall of the first groove is a semi-closed structure;
a buffer layer disposed on the flexible substrate;
an inorganic encapsulation layer disposed on an upper surface and a lateral surface of the buffer layer and disposed in the first groove; and
a sacrificial layer disposed on the inorganic encapsulation layer in the first groove and filling the first groove;
wherein a length of a part of the buffer layer located in the corner cutting area is less than a length of a part of the flexible substrate located in the corner-cutting area.

20. The display panel of claim 19, wherein a part of the inorganic encapsulation layer located in the first groove is in contact with a bottom wall of the first groove, the upper surface and the lateral surface of the buffer layer.

* * * * *